United States Patent
Liu et al.

(10) Patent No.: US 8,913,201 B2
(45) Date of Patent: Dec. 16, 2014

(54) HYBRID TOUCH DEVICE AND MANUFACTURING METHOD THEREOF

(75) Inventors: Tzu-Chi Liu, Taipei (TW); James Hwang, Taipei (TW)

(73) Assignee: Getac Technology Corporation, Hsinchu County (TW)

( * ) Notice: Subject to any disclaimer, the term of this patent is extended or adjusted under 35 U.S.C. 154(b) by 157 days.

(21) Appl. No.: 13/300,479

(22) Filed: Nov. 18, 2011

(65) Prior Publication Data

US 2012/0200337 A1   Aug. 9, 2012

Related U.S. Application Data

(60) Provisional application No. 61/444,110, filed on Feb. 17, 2011.

(30) Foreign Application Priority Data

Mar. 25, 2011   (CN) .......................... 2011 1 0081305

(51) Int. Cl.
| | |
|---|---|
| *G02F 1/1335* | (2006.01) |
| *G06F 3/044* | (2006.01) |
| *G06F 3/045* | (2006.01) |
| *H03K 17/96* | (2006.01) |

(52) U.S. Cl.
CPC ................ *G06F 3/044* (2013.01); *G06F 3/045* (2013.01); *G06F 2203/04106* (2013.01); *H03K 17/9622* (2013.01); *H03K 17/9647* (2013.01)
USPC .......................................................... 349/12

(58) Field of Classification Search
USPC ............................................................ 349/12
See application file for complete search history.

(56) References Cited

U.S. PATENT DOCUMENTS

| | | | | |
|---|---|---|---|---|
| 2008/0266273 | A1* | 10/2008 | Slobodin et al. | 345/174 |
| 2009/0096762 | A1* | 4/2009 | Hinata | 345/174 |
| 2010/0279738 | A1* | 11/2010 | Kim et al. | 455/566 |

FOREIGN PATENT DOCUMENTS

| | | |
|---|---|---|
| CN | 101261552 A | 9/2008 |
| CN | 101887321 A | 11/2010 |
| TW | M335736 | 7/2008 |
| TW | 200921494 A | 5/2009 |

* cited by examiner

*Primary Examiner* — Timothy L Rude

(57) ABSTRACT

A hybrid touch device includes a direct touch unit and an indirect touch unit disposed at two sides respectively. The direct touch unit includes a base layer, a sensing line layer, a driving line layer, a bonding layer, and a covering layer. The indirect touch unit includes a first conducting layer, a second conducting layer, and a plurality of spacers between the first conducting layer and the second conducting layer. An optically clear adhesive (OCA) layer is disposed between the direct touch unit and the indirect touch unit. The base layer of the direct touch unit is a conductive film. A shielding layer is disposed between the conductive film and the OCA layer. The second conducting layer of the indirect touch unit is a thin conductive glass.

8 Claims, 4 Drawing Sheets

HYBRID TOUCH DEVICE AND MANUFACTURING METHOD THEREOF

BACKGROUND OF THE INVENTION

1. Field of Invention

The present invention relates to a touch device and a manufacturing method thereof, and more particularly to a hybrid touch device combining functions of capacitive touch and resistive touch and a manufacturing method thereof.

2. Related Art

In recent years, with the increasing mature of the touch panel technology, various kinds of touch devices are widely applied to electronic products. Generally, the touch panels can be roughly divided into resistive touch panels, capacitive touch panels, and electromagnetic touch panels, and these touch panels have different advantages and disadvantages.

The resistive touch panel features a simple technology and is not easily interfered by the environment. However, since two conducting layers in the resistive touch panel are not all glass and generally have a light transmittance of only about 80% to 85%, the light transmittance of the resistive touch panel is low. In addition, as the resistive touch panel operates, a touch signal can be generated accurately only when the upper and lower conducting layers contact each other. Therefore, the user needs to press hard, and it is easy to damage the conducting layers and reduce the service life of the resistive touch panel.

Compared with the resistive touch panel, the capacitive touch panel is more convenient. A touch signal can be generated when the user touches the capacitive touch panel lightly with fingers, and thus it is not easy to abrade the capacitive touch panel. However, it is not easy to generate the touch signal accurately when the user wears gloves to touch the capacitive touch panel.

SUMMARY OF THE INVENTION

The present invention is a hybrid touch device, comprising a direct touch unit disposed at an outer side and an indirect touch unit disposed at an inner side. The direct touch unit comprises a base layer, a sensing line layer, a driving line layer, a bonding layer, and a covering layer. The indirect touch unit comprises a first conducting layer, a second conducting layer, and a plurality of spacers between the first conducting layer and the second conducting layer. An optically clear adhesive (OCA) layer is disposed between the direct touch unit and the indirect touch unit. The base layer is a conductive film, and a shielding layer is disposed between the conductive film and the OCA layer. The second conducting layer of the indirect touch unit is a thin conductive glass.

The present invention is a method for manufacturing a hybrid touch device, comprising: providing a first conducting layer; forming a plurality of spacers and a second conducting layer on the first conducting layer in sequence, in which the second conducting layer is a thin conductive glass; providing a base layer; forming a sensing line layer, a driving line layer, a bonding layer, and a covering layer on the base layer in sequence, in which the base layer is a conductive film; and forming an OCA layer and a shielding layer respectively between the second conducting layer and the base layer.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Figure 1:
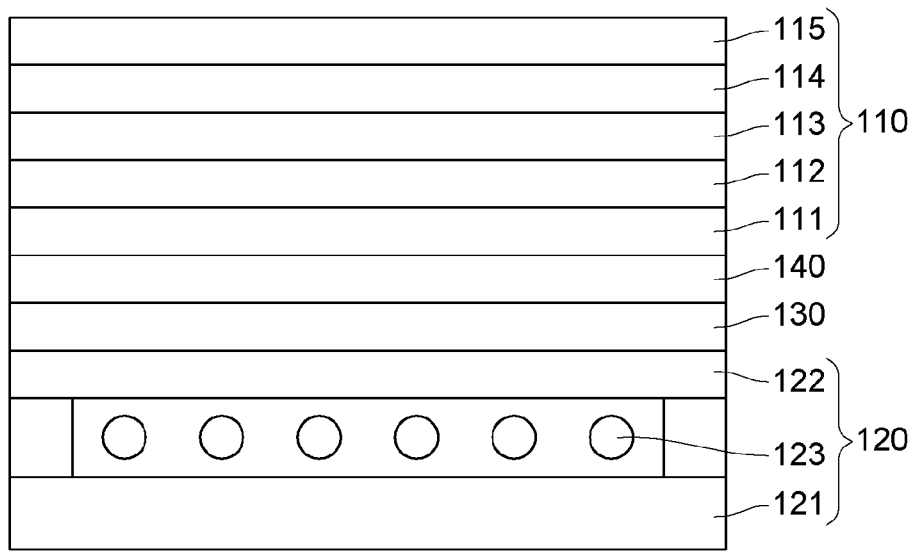
FIG. 1 is a sectional structural view of a hybrid touch device according to a first embodiment.

FIG. 1 is a sectional structural view of a hybrid touch device according to a first embodiment. Referring to FIG. 1, the hybrid touch device 100 comprises a direct touch unit 110 and an indirect touch unit 120. The direct touch unit 110 is disposed at an outer side and allows the user to make direct contacts and operations. The indirect touch unit 120 is disposed at an inner side and allows the user to make indirect operations through the direct touch unit 110. In this embodiment, the direct touch unit 110 is a capacitive touch panel, and the indirect touch unit 120 is a resistive touch panel. Therefore, the hybrid touch device 100 has the functions of resistive touch and capacitive touch at the same time.

The direct touch unit 110 respectively comprises a base layer 111, a sensing line layer 112, a driving line layer 113, a bonding layer 114, and a covering layer 115 from the inner side to the outer side. The base layer 111 may be a conductive film, for example, an Indium Tin Oxide (ITO) film, for reducing the thickness of the direct touch unit 110, so as to reduce the touch force of the user and transfer the touch force to the indirect touch unit 120 effectively when the user operates the indirect touch unit 120 through the direct touch unit 110. The sensing line layer 112 comprises a plurality of spaced sensing lines, the driving line layer 113 comprises a plurality of spaced driving lines, and the driving lines and the sensing lines are intersected and form a sensing capacitance at each intersected node. The driving lines and the sensing lines are all transparent conducting wires, for example, made of ITO. The bonding layer 114 may be OCA, for bonding the driving line layer 113 and the covering layer 115. The covering layer 115 may be glass, which can improve scratch resistance and compressive strength of the direct touch unit 110 through chemical strengthening treatment, for example, ion exchange treatment.

The indirect touch unit 120 further comprises a first conducting layer 121, a second conducting layer 122, and a plurality of spacers 123. The first conducting layer 121 is located at an inner side of the indirect touch unit 120. The second conducting layer 122 is located at an outer side of the indirect touch unit 120, and is corresponding to the base layer 111. The spacers 123 are located between the first conducting layer 121 and the second conducting layer 122. The second conducting layer 122 may be a thin conductive glass, such as ITO glass, and the thickness of the thin conductive glass may be 0.1 mm. The hardness of the thin conductive glass is greater than that of the conductive film (ITO film); therefore, in the case that the user operates (that is, presses) the hybrid touch device 100 for a long time, the probability of twisting deformation of the second conducting layer 122 may be effectively reduced and the service life of the hybrid touch device 100 is increased. The first conducting layer 121 may be a conductive glass, for example, ITO glass, and a touch signal is generated when the first conducting layer 121 and the second conducting layer 122 contact each other. The spacers 123 may be isolators, for isolating the first conducting layer 121 and the second conducting layer 122, so as to avoid a short circuit without touch and occurrence of false operation.

In this embodiment, an OCA layer 130 is disposed between the direct touch unit 110 and the indirect touch unit 120, for bonding the direct touch unit 110 and the indirect touch unit 120. No matter whether the signal is generated by the direct touch unit 110 or the indirect touch unit 120, touch coordinate positions generated by the user are identical.

Additionally, a shielding layer 140, for example, a shielding film, is disposed between the base layer 111 and the OCA layer 130, for blocking noises (such as electromagnetic interference) generated by the indirect touch unit 120, so as to avoid that the direct touch unit 110 is interfered by the noises and generates false operation. The shielding layer 140 may be formed by polyethylene terephthalate (PET) base materials plated with metal wires. The metal wires may be latticed or in an irregular shape. The thicker the metal wires are, the lower the light transmittance of the shielding layer 140 is, and the greater the anti-electromagnetic interference capability is; while the thinner the metal wires are, the higher the light transmittance of the shielding layer 140 is, and the lower the anti-electromagnetic interference capability is.

Figure 2:
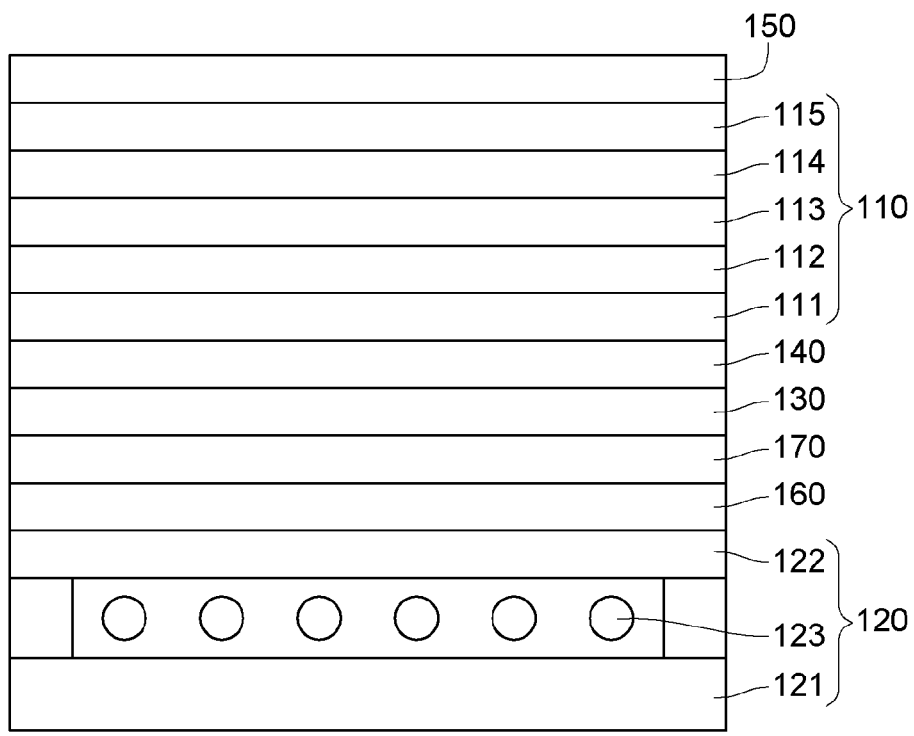
FIG. 2 is a sectional structural view of a hybrid touch device according to a second embodiment.

FIG. 2 is a sectional structural view of a hybrid touch device according to a second embodiment. Referring to FIG. 2, in this embodiment, for the configuration relations and functions of the direct touch unit 110, the base layer 111, the sensing line layer 112, the driving line layer 113, the bonding layer 114, the covering layer 115, the indirect touch unit 120, the first conducting layer 121, the second conducting layer 122, the spacers 123, the OCA layer 130, and the shielding layer 140, reference can be made to the description in the first embodiment, and will not be repeated herein. Besides, the hybrid touch device 100 further comprises an anti-reflection and anti-glare sheet 150, a retarder 160, and a polarizer 170.

The anti-reflection and anti-glare sheet 150 may be disposed at an outer side of the covering layer 115. The retarder 160 may be disposed between the OCA layer 130 and the second conducting layer 122 of the indirect touch unit 120. The polarizer 170 may be disposed between the OCA layer 130 and the retarder 160. The anti-reflection and anti-glare sheet 150 may be made of an inorganic metal oxide material (for example, $MgF_2$), and formed by means of film plating, sol coating, or nano coating, for improving the light transmittance. The retarder 160 may be a quarter wave plate, which uses the principle of phase retardation to rotate an incident polarized light at a certain polarizing angle. The polarizer 170 may be an iodine polarizer or a dye type polarizer, that allows light in a particular polarization direction to pass through, for example, vertical polarized light, horizontal polarized light, or circular polarized light, thereby achieving the light polarized effect. In this manner, the visibility of the hybrid touch device 100 outdoors or in the sun can be increased with the above configuration mode.

Figure 3:
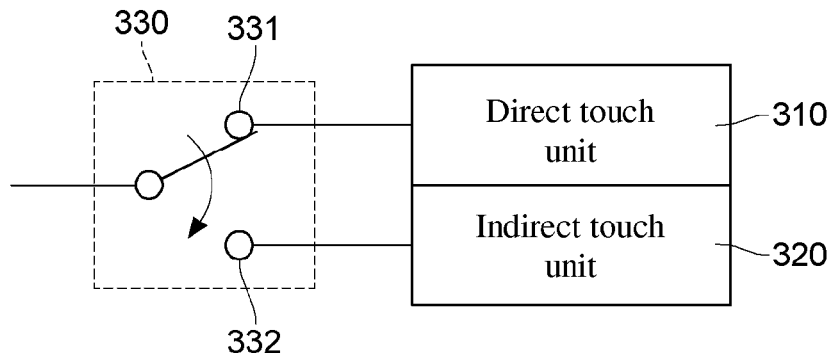
FIG. 3 is a circuit block diagram of a hybrid touch device according to a third embodiment.

FIG. 3 is a circuit block diagram of a hybrid touch device according to a third embodiment. Referring to FIG. 3, the hybrid touch device 300 comprises a direct touch unit 310, an indirect touch unit 320, and a control unit 330. In this embodiment, for the internal structures and functions of the direct touch unit 310 and the indirect touch unit 320, reference can be made to the first and second embodiments, and will not be repeated herein. The control unit 330 of this embodiment is electrically connected to the direct touch unit 310 and the indirect touch unit 320, for selectively driving the direct touch unit 310 and the indirect touch unit 320.

In this embodiment, the control unit 330 may be a physical switch, or may be other elements having a switching mechanism. The control unit 330 (that is, switch) may also be electrically connected to a power supply (not shown), for selectively supplying power to the direct touch unit 310 and the indirect touch unit 320. The user can switch the control unit 330 as required (that is, whether the user wears gloves or not), so as to selectively drive the direct touch unit 310 and the indirect touch unit 320 to operate the hybrid touch device 300. For instance, when the user does not wear gloves, the user may switch the control unit 330 to a first position (331 as shown in FIG. 3), and the power supply only supplies power to the direct touch unit 310 through the control unit 330. At this time, the user can generate a touch signal through the direct touch unit 310 (that is, a capacitive touch unit).

Moreover, when the user wears gloves to operate the hybrid touch device 300, the user may switch the control unit 330 to a second position (332 as shown in FIG. 3), and the power supply only supplies power to the indirect touch unit 320 through the control unit 330. At this time, the user can generate a touch signal through the indirect touch unit 320 (that is, a resistive touch unit).

Figure 4:
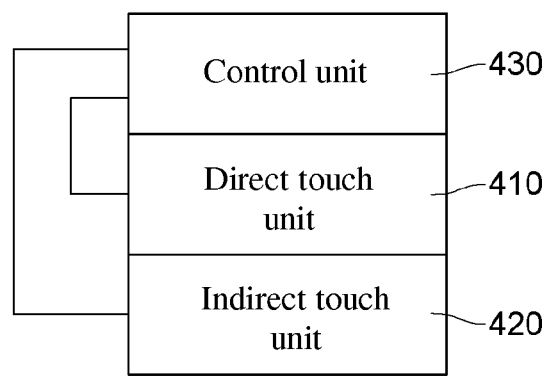
FIG. 4 is a circuit block diagram of a hybrid touch device according to a fourth embodiment.

FIG. 4 is a circuit block diagram of a hybrid touch device according to a fourth embodiment. Referring to FIG. 4, the hybrid touch device 400 comprises a direct touch unit 410, an indirect touch unit 420, and a control unit 430. In this embodiment, for the internal structures and functions of the direct touch unit 410 and the indirect touch unit 420, reference can be made to the first and second embodiments, and will not be repeated herein. The control unit 430 of this embodiment is electrically connected to the direct touch unit 410 and the indirect touch unit 420, and is disposed on the direct touch unit 410. Moreover, the control unit 430 may selectively drive the direct touch unit 410 and the indirect touch unit 420 according to a pressing stress.

In this embodiment, the control unit 430 may, for example, according to a magnitude value of the pressing stress, according to a pressing time of the pressing stress, or simultaneously according to the magnitude value and the pressing time of the pressing stress, be switched to generate a touch signal with the direct touch unit 410 or the indirect touch unit 420. If the control unit 430 takes the magnitude value of the pressing stress as a basis for switching the direct touch unit 410 or the indirect touch unit 420, the user may preset a threshold value of the pressing stress as required. For example, when the pressing stress of the user is smaller than the threshold value, the control unit 430 may selectively drive the direct touch unit 410; and when the pressing stress of the user is greater than the threshold value, the control unit 430 may selectively drive the indirect touch unit 420.

Additionally, if the control unit 430 takes the pressing time of the pressing stress as a basis for switching the direct touch unit 410 or the indirect touch unit 420, the user may preset a pressing threshold time as required. For example, when the user presses the hybrid touch device 400 and the pressing time does not exceed the pressing threshold time (for example, 1 s), the control unit 430 may selectively drive the direct touch unit 410; and when the user presses the hybrid touch device 400 and the pressing time exceeds the pressing threshold time, the control unit 430 may selectively drive the indirect touch unit 420. Besides, if the control unit 430 simultaneously takes the magnitude value and the pressing time of the pressing stress as a basis for switching, the control unit 430 may drive the indirect touch unit 420 as long as one of the magnitude value and the pressing time of the pressing stress exceeds the threshold; on the contrary, the control unit 430 may drive the direct touch unit 410.

Figure 5:
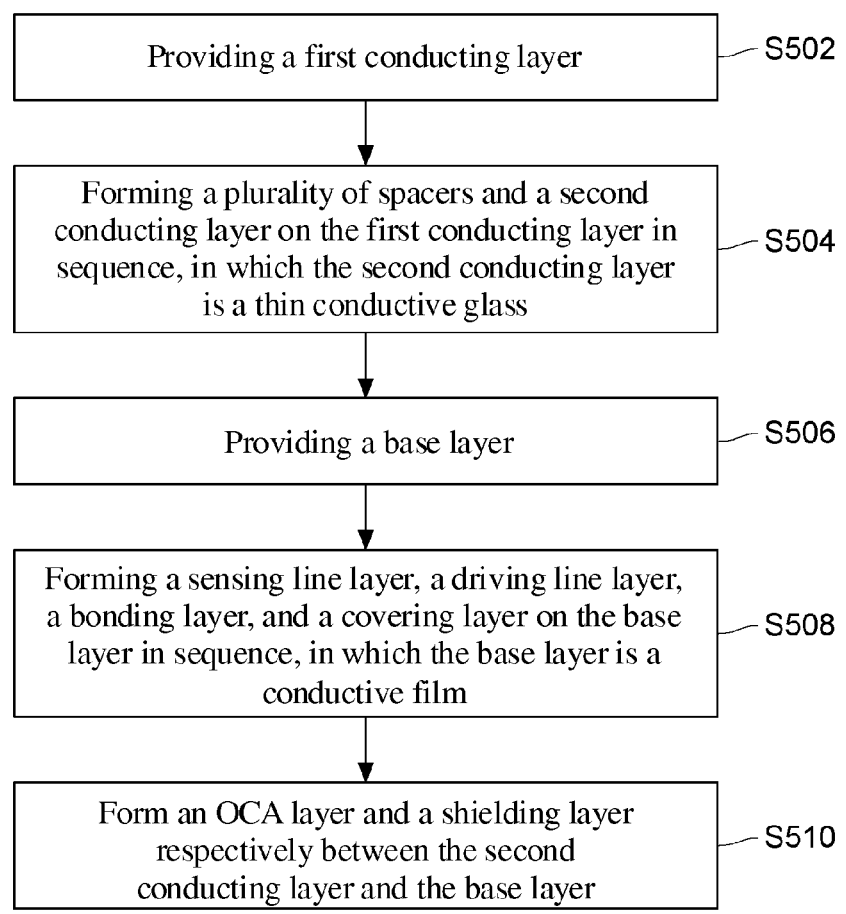
FIG. 5 is a flow chart of a method for manufacturing a hybrid touch device according to a fifth embodiment.

A method for manufacturing a hybrid touch device can be concluded from the description of the first embodiment. FIG. 5 is a flow chart of a method for manufacturing a hybrid touch device according to a fifth embodiment. Referring to FIG. 5, firstly, in step S502, a first conducting layer is provided. In step S504, a plurality of spacers and a second conducting layer are formed on the first conducting layer in sequence, in which the second conducting layer is a thin conductive glass. The first conducting layer, the plurality of spacers, and the second conducting layer form the "indirect touch unit" in the first embodiment, that is, the resistive touch panel. In step S506, a base layer is provided. In step S508, a sensing line layer, a driving line layer, a bonding layer, and a covering layer are formed on the base layer in sequence, in which the base layer is a conductive film. The base layer, the sensing line layer, the driving line layer, the bonding layer, and the covering layer form the "direct touch unit" in the first embodiment, that is, the capacitive touch panel. Next, in step S510, an OCA layer and a shielding layer are formed respectively between the second conducting layer and the base layer. The thickness of the second conducting layer may be 0.1 mm.

In this embodiment, the indirect touch unit and the direct touch unit of the first embodiment are manufactured respectively, and the OCA layer and the shielding layer are finally formed between the indirect touch unit and the direct touch unit. However, the indirect touch unit of the first embodiment may also be formed firstly, the OCA layer and the shielding layer are then formed in sequence, and the direct touch unit of the first embodiment is finally formed on the shielding layer. That is to say, the manufacturing process may be carried out in the following steps. Firstly, a first conducting layer is provided. Next, a plurality of spacers and a second conducting layer are formed on the first conducting layer in sequence, in which the second conducting layer is a thin conductive glass, that is, the indirect touch unit of the first embodiment is formed. Then, an OCA layer and a shielding layer are formed on the second conducting layer in sequence. Finally, a base layer, a sensing line layer, a driving line layer, a bonding layer, and a covering layer are formed on the shielding layer in sequence, in which the base layer is a conductive film, that is, the direct touch unit of the first embodiment is formed.

Figure 6:
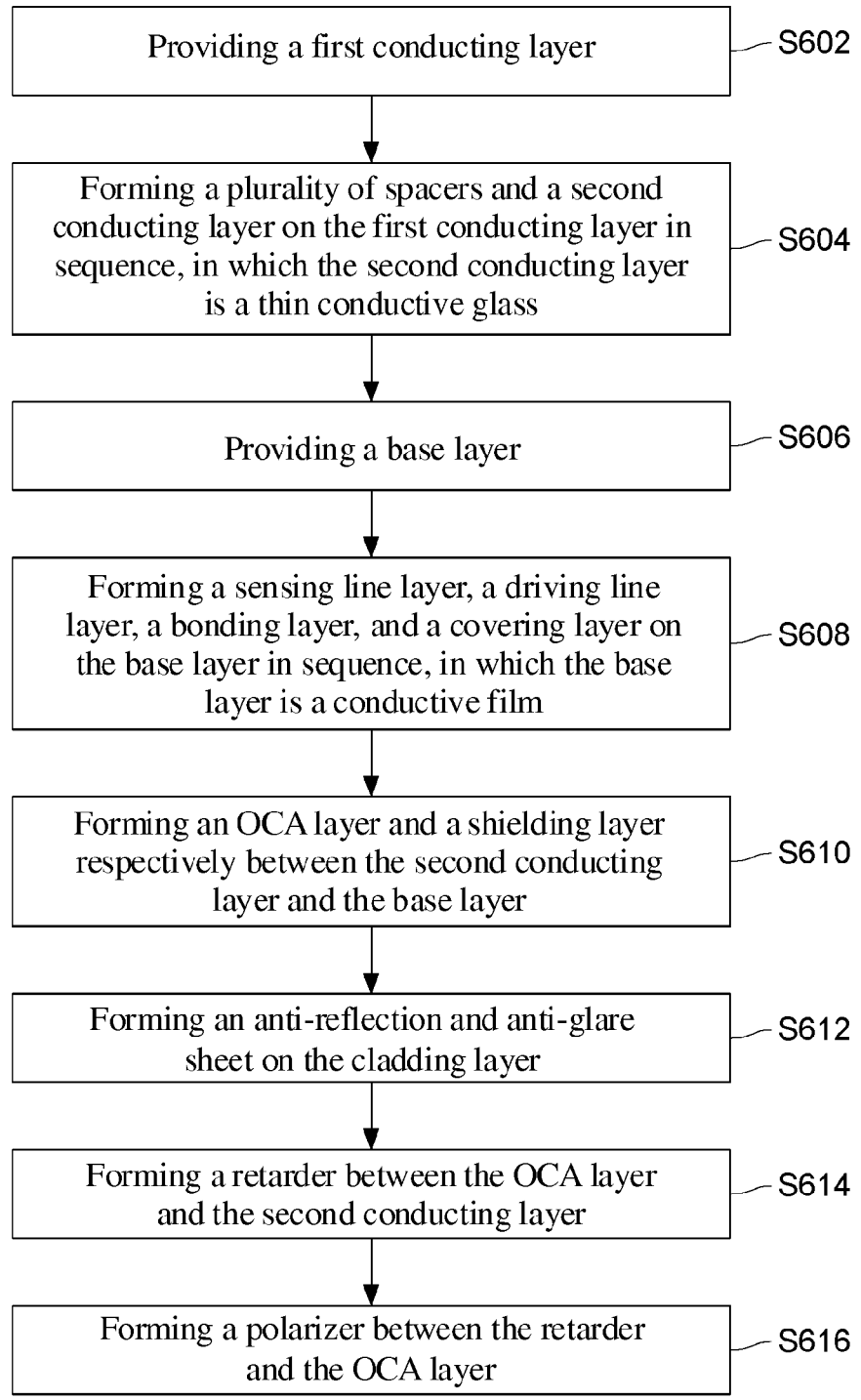
FIG. 6 is a flow chart of a method for manufacturing a hybrid touch device according to a sixth embodiment.

A method for manufacturing a hybrid touch device can be concluded from the description of the second embodiment. FIG. 6 is a flow chart of a method for manufacturing a hybrid touch device according to a sixth embodiment. Referring to FIG. 6, firstly, for steps S602 to S610 of this embodiment, reference can be made to the description of steps S502 to S510 of the embodiment in FIG. 5, that is, the indirect touch unit and the direct touch unit of the second embodiment are manufactured respectively, and the OCA layer and the shielding layer are finally formed between the indirect touch unit and the direct touch unit. However, the indirect touch unit of the second embodiment may be formed firstly, the OCA layer and the shielding layer are then formed in sequence, and the direct touch unit of the second embodiment is finally formed on the shielding layer. Next, after step S610 and in step S612, an anti-reflection and anti-glare sheet is formed on the covering layer. In step S614, a retarder is formed between the OCA layer and the second conducting layer. In step S616, a polarizer is formed between the retarder and the OCA layer. The thickness of the second conducting layer may be 0.1 mm; the first conducting layer, the plurality of spacers, and the second conducting layer form the "indirect touch unit" in the second embodiment, that is, the resistive touch panel; and the base layer, the sensing line layer, the driving line layer, the bonding layer, and the covering layer form the "direct touch unit" in the second embodiment, that is, the capacitive touch panel.

In this embodiment, the anti-reflection and anti-glare sheet is formed on the covering layer, and the retarder and the polarizer are formed between the OCA layer and the second conducting layer respectively. However, it is possible that only the anti-reflection and anti-glare sheet is formed on the covering layer, or only the polarizer is formed between the OCA layer and the second conducting layer, or only the retarder and the polarizer are formed between the OCA layer and the second conducting layer respectively. The above manufacturing modes can increase the visibility of the hybrid touch device outdoors or in the sun.

In the above embodiments, the following structure makes the touch device have the preferable configuration structure and operation performance: the direct touch unit and the indirect touch unit are disposed at two sides of the hybrid touch device, the base layer of the direct touch unit is a conductive film in place of a conventional conductive glass, the second conducting layer of the indirect touch unit is a thin conductive glass in place of a conventional conductive film, an OCA layer is disposed between the direct touch unit and the indirect touch unit, and a shielding film is disposed between the conductive film and the OCA layer.

Having now fully described this invention, it will be appreciated by those skilled in the art that the same can be performed within a wide range of equivalent parameter, concentrations and conditions without departing from the spirit and scope of the invention and without undue experimentation. While this invention has been described in connection with specific embodiments thereof, it will be understood that it is capable of further modifications. This application is intended to cover any variations, uses, or adaptations of the inventions following, in general, the principles of the invention and including such departures from the present disclosure as come within known or customary practice within the art to which the invention pertains and as may be applied to the essential features hereinbefore set forth as follows the scope of the appended claim.

What is claimed is:

1. A hybrid touch device, comprising: a direct touch unit disposed at an outer side and an indirect touch unit disposed at an inner side;
   the direct touch unit comprising a base layer, a sensing line layer, a driving line layer, a bonding layer, and a covering layer;
   the indirect touch unit comprising a first conducting layer, a second conducting layer, and a plurality of spacers between the first conducting layer and the second conducting layer,
   wherein an optically clear adhesive (OCA) layer is disposed between the direct touch unit and the indirect touch unit, the base layer is a conductive film, a shielding layer is disposed between the conductive film and the OCA layer, and the second conducting layer of the indirect touch unit is a thin conductive glass; and
   a control unit, electrically connected to the direct touch unit and the indirect touch unit, configured to selectively exclusively drive one of the direct touch unit or the indirect touch unit according to a manual input by a user.

2. The hybrid touch device according to claim 1, wherein a thickness of the second conducting layer is 0.1 mm.

3. The hybrid touch device according to claim 1, further comprising:
   an anti-reflection and anti-glare sheet, disposed at an outer side of the covering layer;

a retarder, disposed between the OCA layer and the second conducting layer; and a polarizer, disposed between the retarder and the OCA layer.

4. The hybrid touch device according to claim 1, wherein the control unit is a switch configured to receive the manual input.

5. The hybrid touch device according to claim 1, wherein the manual input is a pressing stress.

6. The hybrid touch device according to claim 5, wherein the manual input is a magnitude value of the pressing stress.

7. The hybrid touch device according to claim 5, wherein the manual input is a pressing time of the pressing stress.

8. The hybrid touch device according to claim 5, wherein the manual input is a magnitude value and a pressing time of the pressing stress.

* * * * *